United States Patent
Takaya et al.

(10) Patent No.: US 8,933,483 B2
(45) Date of Patent: Jan. 13, 2015

(54) SEMICONDUCTOR DEVICE

(71) Applicants: Hidefumi Takaya, Miyoshi (JP); Kimimori Hamada, Toyota (JP); Yuji Nishibe, Owariasahi (JP)

(72) Inventors: Hidefumi Takaya, Miyoshi (JP); Kimimori Hamada, Toyota (JP); Yuji Nishibe, Owariasahi (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 14/074,212

(22) Filed: Nov. 7, 2013

(65) Prior Publication Data
US 2014/0054688 A1 Feb. 27, 2014

Related U.S. Application Data

(62) Division of application No. 13/321,714, filed as application No. PCT/JP2009/059816 on May 28, 2009, now Pat. No. 8,809,986.

(51) Int. Cl.
*H01L 29/78* (2006.01)
*H01L 29/08* (2006.01)
(Continued)

(52) U.S. Cl.
CPC ........ *H01L 29/7815* (2013.01); *H01L 29/0873* (2013.01); *H01L 29/0878* (2013.01); *H01L 29/0886* (2013.01); *H01L 29/1095* (2013.01); *H01L 29/0653* (2013.01)
USPC ........... 257/174; 257/328; 257/126; 257/173; 257/171; 257/329; 257/E29.198; 257/E29.027; 257/E23.092; 438/270; 438/284

(58) Field of Classification Search
CPC ............ H01L 27/0248; H01L 29/7395; H01L 29/1095; H01L 27/0266
USPC .......... 257/139, 173, 500, 360, 362, 138, 142
See application file for complete search history.

(56) References Cited

U.S. PATENT DOCUMENTS 5,235,158 A 8/1993 Marini et al.
5,272,392 A 12/1993 Wong et al.
(Continued)

FOREIGN PATENT DOCUMENTS

JP 4-231307 A 8/1992
JP 6-217453 A 8/1994
(Continued)

*Primary Examiner* — Jerome Jackson, Jr.
*Assistant Examiner* — Bo Fan
(74) *Attorney, Agent, or Firm* — Kenyon & Kenyon LLP

(57) ABSTRACT

Provided is a semiconductor device capable of reducing a temperature-dependent variation of a current sense ratio and accurately detecting current In the semiconductor device, at least one of an impurity concentration and a thickness of each semiconductor layer is adjusted such that a value calculated by a following equation is less than a predetermined value:

$$\left[\sum_{i=1}^{n}(R_{Mi} \times k_{Mi}) - \sum_{i=1}^{n}(R_{Si} \times k_{Si})\right] / \sum_{i=1}^{n}(R_{Mi} \times k_{Mi})$$

where a temperature-dependent resistance changing rate of an i-th semiconductor layer (i=1 to n) of the main element domain is $R_{Mi}$; a resistance ratio of the i-th semiconductor layer of the main element domain relative to the entire main element domain is $k_{Mi}$; a temperature-dependent resistance changing rate of the i-th semiconductor layer of the sense element domain is $R_{Si}$; and a resistance ratio of the i-th semiconductor layer of the sense element domain to the entire sense element domain is $k_{Si}$.

2 Claims, 10 Drawing Sheets

(51) Int. Cl.
  *H01L 29/10* (2006.01)
  *H01L 29/06* (2006.01)

(56) References Cited

U.S. PATENT DOCUMENTS

| | | | |
|---|---|---|---|
| 5,341,003 A | | 8/1994 | Obinata |
| 5,654,560 A | | 8/1997 | Nishizawa et al. |
| 5,729,032 A | * | 3/1998 | Tomomatsu et al. .......... 257/139 |
| 6,002,153 A | | 12/1999 | Tsunodo et al. |
| 6,060,744 A | | 5/2000 | Kuwahara et al. |
| 6,180,966 B1 | * | 1/2001 | Kohno et al. ................. 257/173 |
| 2005/0001246 A1 | * | 1/2005 | Mouli ........................... 257/291 |
| 2005/0174823 A1 | * | 8/2005 | Cao et al. ........................ 365/51 |
| 2008/0230810 A1 | | 9/2008 | Yoshimura |

FOREIGN PATENT DOCUMENTS

| | | | |
|---|---|---|---|
| JP | 9-219518 A | | 8/1997 |
| JP | 9-293856 A | | 11/1997 |
| JP | 10-107282 A | | 4/1998 |
| JP | 10-132871 A | | 5/1998 |
| JP | 10-326897 A | | 12/1998 |
| JP | 10-341016 A | | 12/1998 |
| JP | 11-17179 A | | 1/1999 |
| JP | 2000-338146 A | | 12/2000 |
| JP | 2001-257348 A | | 9/2001 |
| JP | 2001257348 A | * | 9/2001 |
| JP | 2005-50913 A | | 2/2005 |
| JP | 2005050913 A | * | 2/2005 |
| JP | 2008-235788 A | | 10/2008 |

* cited by examiner

|       | Substrate | Drift | Channel |
|-------|-----------|-------|---------|
| Main  | 21%       | 45%   | 34%     |
| Sense | 4%        | 50%   | 46%     |

|       | Substrate | Drift | Channel |
|-------|-----------|-------|---------|
| Main  | 29.7%     | 36.3% | 34.0%   |
| Sense | 2.9%      | 43.1% | 54.0%   |

SEMICONDUCTOR DEVICE

This is a divisional of U.S. patent application Ser. No. 13/321,714, filed Nov. 21, 2011, which is a 371 national phase application of PCT/JP2009/059816 filed May 28, 2009, the contents of both of which are incorporated herein by reference.

TECHNICAL FIELD

The present invention relates to a semiconductor device having current sensing function.

BACKGROUND ART

Patent document 1 discloses an exemplary semiconductor device having a current sensing function. Patent document 1 includes a main element domain and a sense element domain connected in parallel with the main element domain. A plurality of main elements is formed in the main element domain, and a plurality of sense elements is formed in the sense element domain. Current flowing through the semiconductor device is divided into a main current flowing through the main element domain and a sense current flowing through the sense element domain. A main current value is a value corresponding to the number of main elements, and a sense current value is a value corresponding to the number of sense elements. Accordingly, a current sense ratio obtained by dividing the main current value by the sense current value is constant. Thus, if the value of the sense current flowing through the sense element domain is measured, the main current value can be calculated from the measured sense current value and the current sense ratio.

CITATION LIST

Patent Literature

Patent Document 1: Japanese Patent Application Publication No. H10-107282

SUMMARY OF INVENTION

Technical Problem

In such a semiconductor device, each of the main element domain and the sense element domain includes a semiconductor region in which a plurality of semiconductor layers is laminated. When the semiconductor device turns on, current flows in a lamination direction of the semiconductor layers in the semiconductor region of each of the main element domain and the sense element domain. For this reason, the electric resistance of the main element domain and the electric resistance of the sense element domain are determined by the electric resistance of each semiconductor layer. The semiconductor region of the main element domain and the semiconductor region of the sense element domain typically have the same configuration. Specifically, the thicknesses of a semiconductor layer is set to be equal to that of a corresponding semiconductor layer, and the impurity concentration of the semiconductor layer is set to be equal to that of the corresponding semiconductor layer. Accordingly, even if the temperature of the semiconductor device changes, when the temperature of each semiconductor layer of the main element domain and the temperature of each semiconductor layer of the sense element domain change in the same way, the electric resistance of each semiconductor layer of the main element domain and the electric resistance of each semiconductor layer of the sense element domain are to change in the same way and the current sense ratio is to be maintained at a certain value.

However, because the number of main elements formed in the main element domain is greatly different from the number of sense elements formed in the sense element domain, the size of the main element domain is greatly different from the size of the sense element domain. As a result, the current sense ratio changes depending on the temperature of the semiconductor device.

Specifically, in the main elements disposed along a boundary between the main element domain and the sense element domain, current flows from the outside of the main element domain, whereas in the sense elements disposed along the boundary, current flows from the outside of the sense element domain. In the main element domain, the number of main elements disposed along the boundary is smaller than the number of main elements disposed within the main element domain apart from the boundary. Accordingly, in the main element domain, the effect of current flowing from the outside of the main element domain is small. As a result, in the main element domain, there is no need to take into consideration the effect of current flowing obliquely with respect to the lamination direction of the semiconductor layers, and thus it can be considered that current flows substantially in parallel with the lamination direction of semiconductor layers.

On the other hand, in the sense element domain, the number of sense elements disposed along the boundary is greater than the number of sense elements disposed in the sense element domain apart from the boundary. Accordingly, in the sense element domain, the effect of current flowing from the outside of the sense element domain is large. As a result, in the sense element domain, it is necessary to take into consideration the effect of current flowing obliquely with respect to the lamination direction of the semiconductor layers. When current flows obliquely with respect to the lamination direction of the semiconductor layers, a region (a current path length, a passage section, or the like) in which current flows through the semiconductor layers changes, so that resistance values of the semiconductor layers change.

This results in a difference between a resistance ratio of each semiconductor layer to the entire electric resistance of the main element domain and a resistance ratio of each semiconductor layer to the entire electric resistance of the sense clement domain. In general, temperature-dependent resistance changing rates of each semiconductor layer are different from each other. Thus, when the resistance ratio of each semiconductor layer of the main element domain is different from the resistance ratio of each semiconductor layer of the sense element domain, the temperature-dependent resistance changing rate of the entire main element domain is different from the temperature-dependent resistance changing rate of the entire sense element domain. Accordingly, even when the temperature of each semiconductor layer of the main element domain and the temperature of each semiconductor layer of the sense element domain change in the same way, the electric resistance of the main element domain and the electric resistance of the sense element domain do not change in the same way and the current sense ratio changes.

The present invention aims to provide a semiconductor device capable of reducing a temperature-dependent variation of a current sense ratio and detecting current with high accuracy.

Solution to Technical Problem

Referring to FIG. 1, a semiconductor device according to an exemplary aspect of the present invention includes a main element domain 4 and a sense element domain 6 disposed adjacent to the main element domain 4. Each of the main element domain 4 and the sense element domain 6 includes a semiconductor region in which semiconductor layers from a first semiconductor layer to an n-th semiconductor layer are laminated in order. When the semiconductor device turns on, current flows in a lamination direction of the semiconductor layers in each of the main element domain 4 and the sense element domain 6. Assume herein that a temperature-dependent resistance changing rate of an i-th semiconductor layer (i=1 to n) of the main element domain 4 is $R_{Mi}$; a resistance ratio of the i-th semiconductor layer of the main element domain 4 relative to the entire main element domain 4 is $k_{Mi}$; a temperature-dependent resistance changing rate of the i-th semiconductor layer of the sense element domain 6 is $R_{Si}$; and a resistance ratio of the i-th semiconductor layer of the sense element domain 6 to the entire sense element domain 6 is $k_{Si}$. In this case, in at least one of the semiconductor layers from the first semiconductor layer to the n-th semiconductor layer of each of the main element domain 4 and the sense element domain 6, at least one of an impurity concentration and a thickness of the at least one of the semiconductor layers of the main element domain 4 is different from that of the at least one of the semiconductor layers of the sense element domain 6 such that a value calculated by a following equation is less than a predetermined value:

$$\left[\sum_{i=1}^{n}(R_{Mi} \times k_{Mi}) - \sum_{i=1}^{n}(R_{Si} \times k_{Si})\right] \bigg/ \sum_{i=1}^{n}(R_{Mi} \times k_{Mi}) \qquad \text{[Equation 1]}$$

In the semiconductor device described above, the temperature-dependent resistance changing rate ($R_{Mi}$, $R_{Si}$) of each semiconductor layer and the resistance ratio of each semiconductor layer ($k_{Mi}$, $k_{Si}$) relative to the entire semiconductor layers are used. Herein, the temperature-dependent resistance changing rate is determined by the impurity concentration or the like of each semiconductor layer and does not change depending on the current flowing direction. On the other hand, the resistance ratio of each semiconductor layer changes depending on the direction of current flowing through the semiconductor region. In other words, when current flows through the semiconductor region in parallel with the lamination direction, the resistance ratio of each semiconductor layer corresponds to the thickness in the lamination direction of each semiconductor layer. Meanwhile, when current flows through the semiconductor region obliquely with respect to the lamination direction, the resistance ratio of each semiconductor layer does not correspond to the thickness in the lamination direction of the semiconductor layers. Accordingly, the use of the resistance ratio ($k_{Mi}$, $k_{Si}$) of each semiconductor layer makes it possible to take into consideration the effect of current flowing through the semiconductor region obliquely with respect to the lamination direction.

In the semiconductor device described above, the temperature-dependent resistance changing rate ($R_{Mi}$ or $R_{Si}$) of each semiconductor layer is multiplied by the resistance ratio ($k_{Mi}$ or $k_{Si}$) of each semiconductor layer for each of the main element domain 4 and the sense element domain 6, to thereby calculate the sum of these multiplication results. Specifically, calculations are performed to obtain a value for evaluating the temperature-dependent resistance changing rate of the entire main element domain and a value for evaluating the temperature-dependent resistance changing rate of the entire sense element domain. Further, at least one of the impurity concentration and the thickness of at least one of the first to n-th semiconductor layers of the main element domain 4 is set to be different from that of at least one of the semiconductor layers of the sense element domain 6 so that the difference between the sum of the multiplication results for the main element domain 4 and the sum of the multiplication results for the sense element domain 6 can be reduced. Accordingly, the difference between the temperature-dependent resistance changing rate of the entire main element domain 4 and the temperature-dependent resistance changing rate of the sense element domain 6 is reduced. As a result, a temperature-dependent variation of the current sense ratio can be reduced.

Examples of the semiconductor device described above include semiconductor devices for power use, such as a MOSFET and an IGBT, but are not limited thereto. Any semiconductor device may be used as long as it includes a main element domain and a sense element domain. Furthermore, the semiconductor layers may be laminated in the vertical direction or lateral direction.

Semiconductor layers to be calculated in the above equation may be appropriately selected from among a plurality of semiconductor layers each serving as a current path when the semiconductor device turns on. For example, only semiconductor layers having a large resistance component may be selected from among the semiconductor layers disposed on a current path. Alternatively, all semiconductor layers disposed on the current path may be selected.

In an exemplary configuration of the semiconductor device described above, each of the main element domain and the sense element domain may include a first semiconductor layer, a second semiconductor layer laminated on the first semiconductor layer, and a third semiconductor layer laminated on the second semiconductor layer. The impurity concentration of the second semiconductor layer may be set to be lower than that of the first semiconductor layer. When the semiconductor device turns on, a channel is formed in the third semiconductor layer of each of the main element domain and the sense element domain, which allows current to flow from the second semiconductor layer to the third semiconductor layer or from the third semiconductor layer to the second semiconductor layer.

In the semiconductor device described above, the impurity concentration of the first semiconductor layer is different from the impurity concentration of the second semiconductor layer. Accordingly, the temperature-dependent resistance changing rate of the first semiconductor layer is different from the temperature-dependent resistance changing rate of the second semiconductor layer. As a result, a temperature-dependent variation of the current sense ratio can be reduced by adjusting the thickness or the like of each of the first semiconductor layer and the second semiconductor layer.

In the semiconductor device according to an exemplary aspect of the present invention, the impurity concentration of the third semiconductor layer of the sense element domain can be set to be lower than that of the third semiconductor layer of the main element domain, for example. The temperature-dependent resistance changing rate of the third semiconductor layer changes with a change of the impurity concentration of the third semiconductor layer. Accordingly, the impurity concentration of the third semiconductor layer of the sense element domain is set to a value different from the impurity concentration of the third semiconductor layer of the main element domain, thereby making it possible to reduce the value calculated by the above equation. This leads to a reduction in the temperature-dependent variation of the current sense ratio.

In the semiconductor device according to an exemplary aspect of the present invention, the thickness of the third semiconductor layer of the sense element domain can be made smaller than that of the third semiconductor layer of the main element domain. The resistance ratio of the third semiconductor layer can be changed by changing the thickness of the third semiconductor layer. Accordingly, the thickness of the third semiconductor layer of the sense element domain is set to a value different from the thickness of the third semiconductor layer of the main element domain, thereby making it possible to reduce the value calculated by the above equation. This leads to a reduction in the temperature-dependent variation of the current sense ratio.

In the semiconductor device according to an aspect of the present invention, the thickness of the first semiconductor layer of the sense element domain may be set to be larger than the thickness of the first semiconductor layer of the main element domain. Also in this configuration, a temperature-dependent variation of the current sense ratio can be reduced.

In an exemplary configuration of the semiconductor device described above, the thickness of the second semiconductor layer of the sense element domain may be made smaller than that of the second semiconductor layer of the main element domain. Also in such a configuration, a temperature-dependent variation of the current sense ratio can be reduced.

In the semiconductor device described above, it is preferable to form a trench between the main element domain and the sense element domain. The formation of a trench between the main element domain and the sense element domain prevents current from flowing obliquely through the semiconductor region. Consequently, a temperature-dependent variation of the current sense ratio can be reduced.

DESCRIPTION OF EMBODIMENTS

First, the main features of an embodiment will be described in detail below.

(First mode) A semiconductor device according to a first mode is a vertical semiconductor device in which current flows in the vertical direction (thickness direction) of a semiconductor substrate.

(Second mode) A semiconductor device according to a second mode is a semiconductor device having the following configuration. That is, a plurality of switching elements is formed in each of a main element domain and a sense element domain. Each switching element includes a first region having a first conductive type, a body region having a second conductive type, a drift region having the first conductive type, and a gate electrode. The first region faces a first surface of a semiconductor region. The body region faces the first surface of the semiconductor region and covers the first region. The drift region is separated from the first region by the body region. The gate electrode faces the body region in a range where the first region is separated from the drift region, with an insulating film interposed therebetween.

Figure 1:
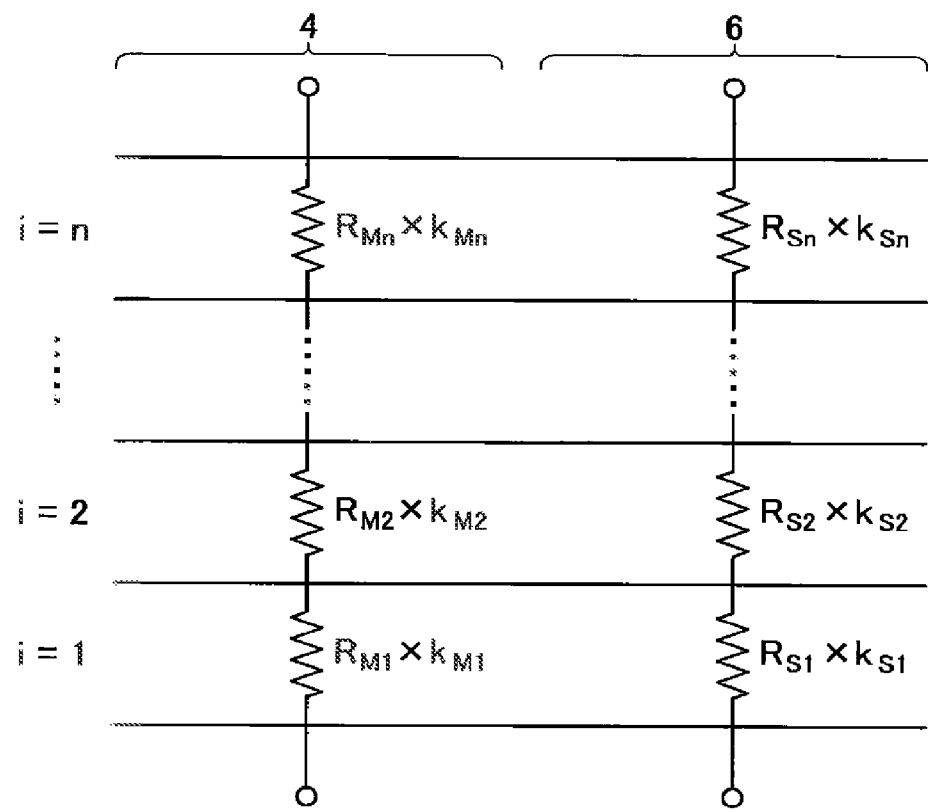
FIG. 1 is a schematic diagram for explaining a configuration of a semiconductor device according to an exemplary aspect of the present invention.
Figure 2:
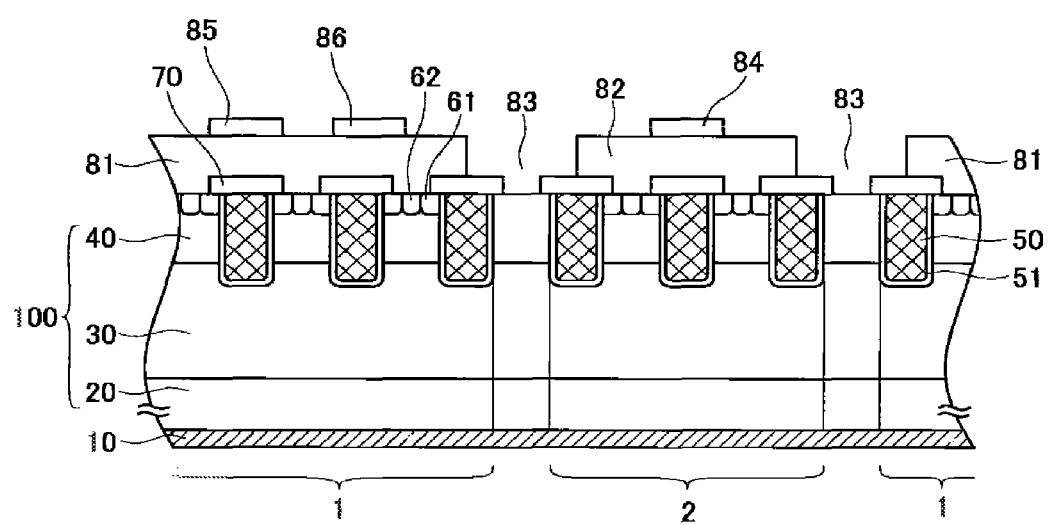
FIG. 2 is a sectional view of a main part of a semiconductor device of an embodiment.

(Embodiment) FIG. 2 shows a sectional view of a main part of a semiconductor device of an embodiment. As shown in FIG. 2, the semiconductor device includes a semiconductor region 100 in which a plurality of semiconductor layers is laminated. The semiconductor region 100 is partitioned into a main element domain 1 and a sense element domain 2. In the main element domain 1, a large number of vertical field-effect transistors (hereinafter, referred to as "MOSFETs") is formed. Main current flows through the MOSFETs in the main element domain 1. A plurality of vertical MOSFETs is formed in the sense element domain 2. Sense current flows through the MOSFETs in the sense element domain 2. The number of MOSFETs formed within the main element domain 1 is much greater than the number of MOSFETs formed within the sense element domain 2. Accordingly, the size of the main element domain 1 is greatly different from the size of the sense element domain 2.

A drain electrode 10 is formed on the back surface of the semiconductor region 100. The drain electrode 10 is made of aluminum. The drain electrode 10 is shared by the MOSFETs formed in the main element domain 1 and the MOSFETs formed in the sense element domain 2.

A main source electrode 81 formed on the main element domain 1 and a sense source electrode 82 formed on the sense element domain 2 are disposed on the surface of the semiconductor region 100. The main source electrode 81 and the sense source electrode 82 are each made of aluminum. The main source electrode 81 and the sense source electrode 82 are electrically insulated by an insulating region 83. In the insulating region 83, a source region 61 and a body contact region 62, which will be described later, are not formed.

The sense source electrode 82 is provided with a sense pad 84. The sense pad 84 is connected to a current detection circuit (not shown) via an aluminum wiring line. The main source electrode 81 is provided with a source pad 85. The source pad 85 is connected to a load (for example, a motor) via an aluminum'wiring line. The main source electrode 81 is provided with a Kelvin pad 86. The Kelvin pad 86 is connected to the current detection circuit via an aluminum wiring line.

Next, the MOSFETs formed in each of the main element domain 1 and the sense element domain 2 will be described. The MOSFETs formed in the main element domain 1 have the same configuration as that of the MOSFETs formed in the sense element domain 2. Accordingly, the configuration of a MOSFET formed in the main element domain 1 will be described by way of example.

Figure 3:
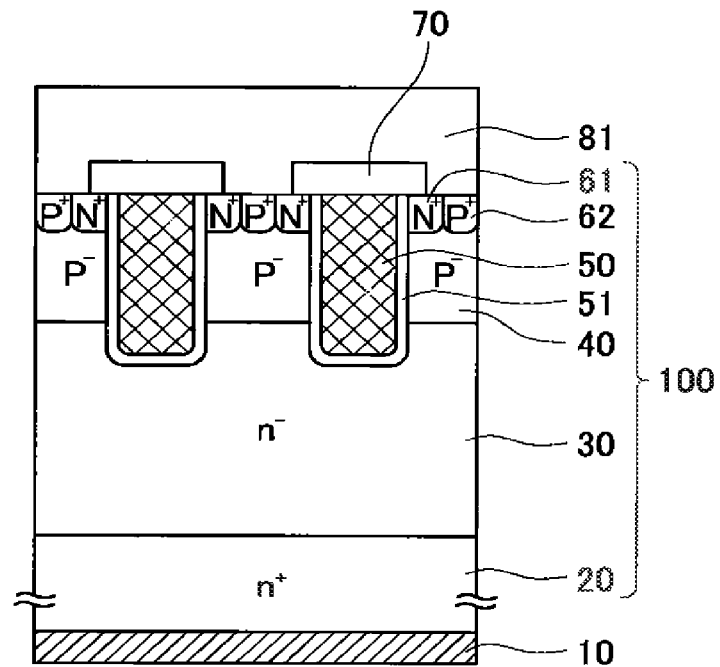
FIG. 3 is a sectional view of a MOSFET of the semiconductor device of an embodiment.

FIG. 3 shows a sectional view of a MOSFET formed in the main element domain 1. As shown in FIG. 3, an $n^+$-type semiconductor substrate (drain region) 20 is formed on the drain electrode 10. The semiconductor substrate 20 is a monocrystalline silicon substrate. An $n^{-1}$-type drift region 30 is formed on the n+-type semiconductor substrate 20. The impurity concentration of the drill region 30 is set to be lower than the impurity concentration of the semiconductor substrate 20. A $p^-$-type body region 40 is formed on the $n^-$-type drift region 30. An $n^+$-type source region 61 and a $p^+$-type body contact region 62 are formed on the $p^-$-type body region 40. A trench gate electrode 50 is formed so as to penetrate the $n^+$-type source region 61 and the $p^-$-type body region 40. The trench gate electrode 50 reaches the drift region 30. Both sides of the trench gate electrode 50 face the source region 61 and the body region 40 through a gate insulating film 51. The trench gate electrode 50 of each MOSFET within the main element domain 1 and the trench gate electrode 50 of each MOSFET within the sense element domain 2 are connected to a common drive circuit (not shown), and turn on/off at the same timing.

A main source electrode 81 is formed on the surface of each of the $n^+$-type source region 61 and the $p^+$-type body contact region 62. The main source electrode 81 is electrically insulated from the trench gate electrode 50 by an insulating film 70.

A procedure for determining the impurity concentration and the thickness of each semiconductor layer (the semiconductor substrate 20, the drift region 30, and the body region 40) of the main element domain 1 and the impurity concentration and the thickness of each semiconductor layer (the semiconductor substrate 20, the drift region 30, and the body region 40) of the sense element domain 2 will be described in detail later.

Next, an operation of the semiconductor device will be described. In order to activate the semiconductor device, an ON potential (i.e., a potential equal to or higher than a minimum potential (gate threshold potential) at which a channel is formed in the body region 40) is applied to each trench gate electrode 50 of each of the MOSFETs of the main element domain 1 and the MOSFETs of the sense element domain 2. When the ON potential is applied to the respective trench gate electrode 50, the channel is formed in the body region 40 near the insulating film 51. This permits electrons to flow from the source region 61 to the drain electrode 10 through the channel formed in the body region 40, the drift region 30, and the semiconductor substrate 20. In other words, in the main element domain 1, a main current $I_m$ flows from the drain electrode 10 to the main source electrode 81. In the sense element domain 2, a sense current $I_s$ flows from the drain electrode 10 to the sense source electrode 82. Since the source region 61 is not formed in the insulating region 83, no current flows through the insulating region 83.

Figure 4:
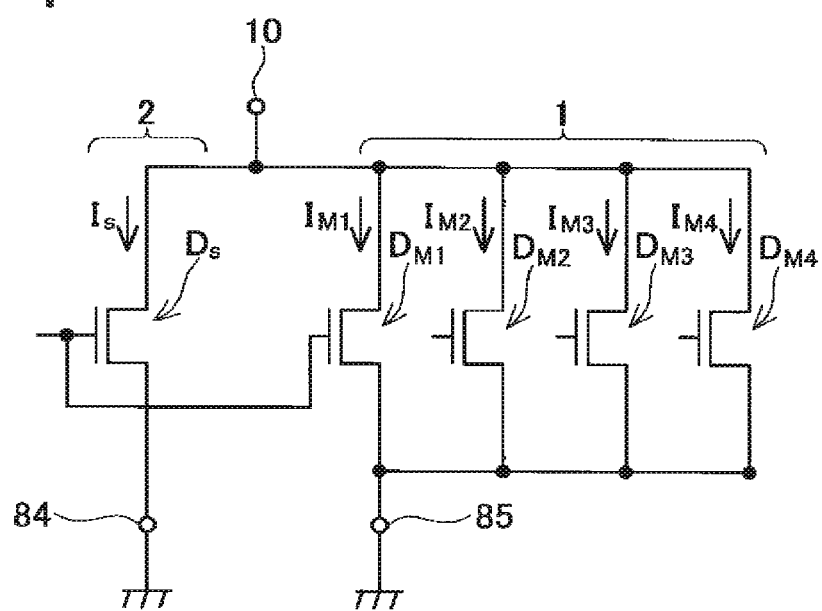
FIG. 4 is a schematic diagram showing a flow of a main current $I_m$ flowing through a main element domain and a flow of a sense current $I_s$ flowing through a sense element domain.

FIG. 4 is a schematic diagram showing a flow of the main current $I_m$ which flows through the main element domain 1 and a flow of the sense current i which flows through the sense element domain 2. As shown in FIG. 4, a large number of MOSFETs ($D_{M1}$ to $D_{M4}$) is disposed in the main element domain 1, and a small number of MOSFETs ($D_s$) is disposed in the sense element domain 2.

In the main element domain 1, currents $I_{M1}$, $I_{M2}$, $I_{M3}$, and $I_{M4}$ flow through the MOSFETs ($D_{M1}$ to $D_{M4}$), respectively. The main current $I_m$ flowing through the MOSFETs ($D_{M1}$ to $D_{M4}$) flows to a load (for example, a motor) through the main source electrode 81 and the source pad 85. The potential of the main source electrode 81 is input to the current detection circuit through the Kelvin pad 86 and a wiring line.

In the sense element domain 2, the sense current $I_s$ flows through the MOSFET ($D_s$). The sense current $I_s$ flowing through the MOSFET ($D_s$) is input to the current detection circuit through the sense source electrode 82 and the sense source pad 84. The current detection circuit detects a current value of the sense current $I_s$ received from the sense source pad 84. When the current value of the sense current $I_s$ is detected, the value of the main current $I_m$ flowing through the main element domain 1 is calculated based on the detected current value of the sense current $I_s$ and the current sense ratio.

Figure 5:
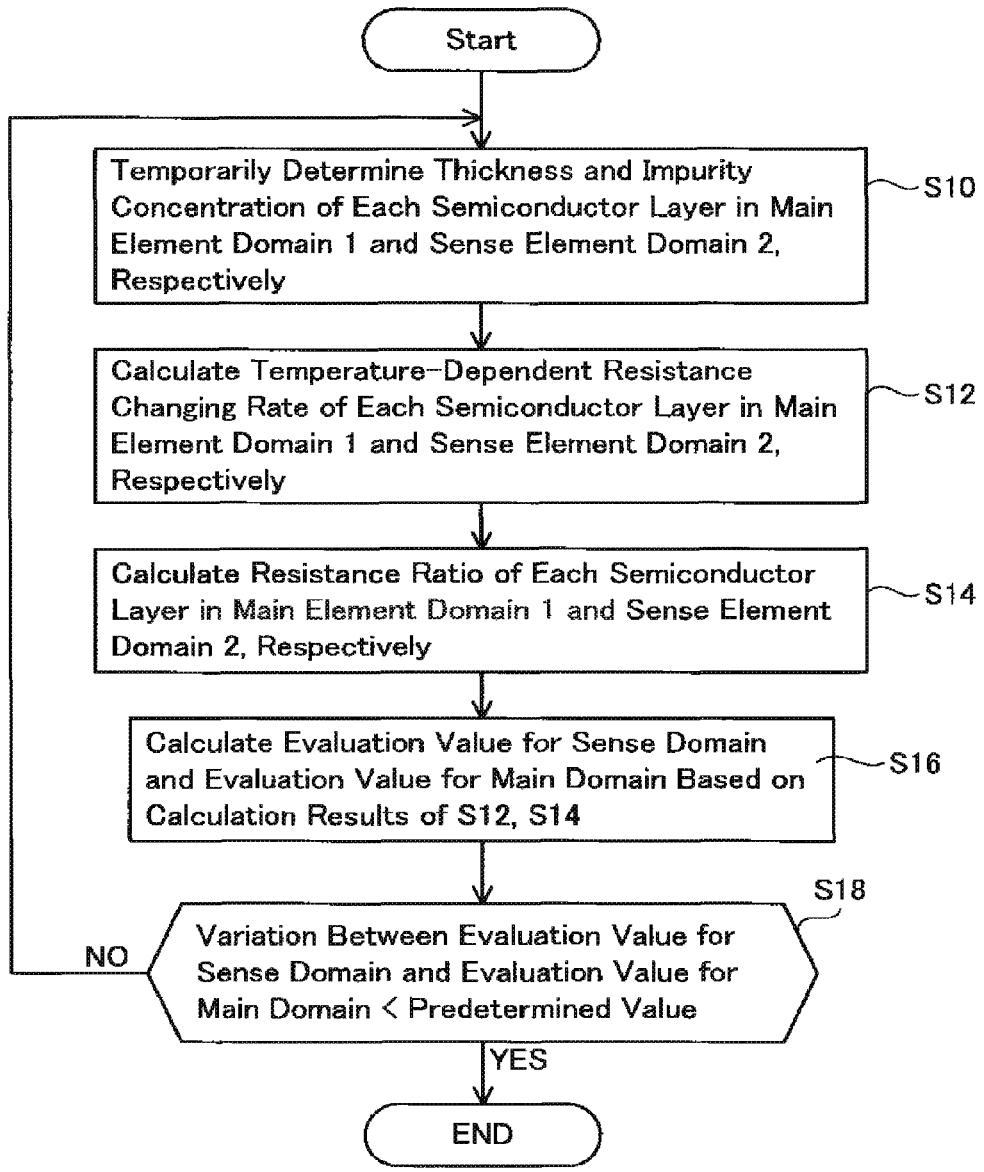
FIG. 5 is a flow chart showing a procedure for determining an impurity concentration and a thickness of each semiconductor layer of each of the main element domain and the sense element domain.

Next, the procedure for determining the impurity concentration and the thickness of each semiconductor layer (i.e., the semiconductor substrate 20, the drift region 30, and the body region 40) of each of the main element domain 1 and the sense element domain 2 will be explained. FIG. 5 is a flow chart showing the procedure for determining the impurity concentration and the thickness of each semiconductor layer of each of the main element domain and the sense element domain.

As shown in FIG. 5, the impurity concentration and the thickness of each semiconductor layer (the semiconductor substrate 20, the drift region 30, and the body region 40) of the main element domain 1 are temporarily determined, and the impurity concentration and the thickness of each semiconductor layer (the semiconductor substrate 20, the drift region 30, and the body region 40) of the sense element domain 2 are temporarily determined (step S10). As a specific example of the determination method, the impurity concentration and the thickness of each of the semiconductor layers 20, 30, and 40 of the main clement domain 1 are determined depending on the intended use of the semiconductor device. Next, the impurity concentration and the thickness of each of the semiconductor layers 20, 30, and 40 of the sense element domain 2 may be determined based on the determined impurity concentration and the thickness of each of the semiconductor layers 20, 30, and 40 of the main element domain 1. In a first calculation, the impurity concentration and the thickness of each of the semiconductor layers 20, 30, and 40 of the sense element domain 2 may be set to values equal to those of the impurity concentration and the thickness of each of the semiconductor layers 20, 30, and 40 of the main element domain 1. If a deviation of the evaluation value calculated in step S18, which will be described later, is not less than a predetermined value, the impurity concentration and the thickness of each of the semiconductor layers 20, 30, and 40 of the main element domain 1 and/or the sense element domain 2 can be changed based on the calculation result After the determination of the impurity concentration of each of the semiconductor layers 20, 30, and 40 of each of the main element domain 1 and the sense element domain 2, a temperature-dependent resistance changing rate ($R_{Mi}$, $R_{Si}$, (i=20, 30, 40)) of each of the semiconductor layers 20, 30, and 40 is calculated using the impurity concentration (step S12). The term "temperature-dependent resistance changing rate" herein described refers to a value for quantitatively evaluating a degree of change of a resistance value with respect to a temperature change. Accordingly, not only a change rate of a resistance value itself, but also a change rate of a physical quantity (for example, a current value) that changes based on a change in resistance value, for example, may be used. In this embodiment, a value obtained by dividing a current value obtained at a predetermined temperature (for example, a maximum temperature within a temperature range used by the semiconductor device) by a current value obtained at a reference temperature (for example, 25° C.) is used as a temperature-dependent resistance changing rate.

In order to calculate the temperature-dependent resistance changing rate, a predetermined potential is first applied to a unit volume of each of the semiconductor layers 20, 30, and 40 at the reference temperature (25° C.), and a value of current flowing through each semiconductor layer is obtained. Then, an appropriate temperature is selected from the temperature range (for example, 0 to 150° C.) used by the semiconductor device, and the predetermined potential is applied to the unit volume of each of the semiconductor layers 20, 30, and 40 at the selected temperature, thereby obtaining the value of current flowing through each semiconductor layer. The current value obtained at the selected temperature is divided by the current value obtained at the reference temperature, to thereby calculate the rate of the current values (temperature-dependent resistance changing rate). The current value at each temperature may be obtained by experiments or calculations. In the case of obtaining the current value by calculations, a well-known device simulator (for example, TCAD (GENNESIS) manufactured by ISE corporation) may be used.

Figures 6, 7:
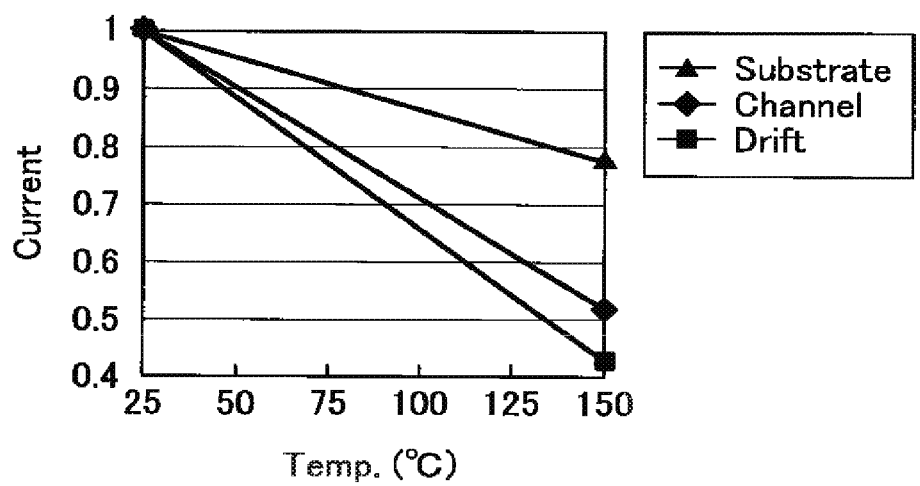
FIG. 6 is a graph showing an example of temperature-dependent resistance changing rate of each semiconductor layer.
FIG. 7 is a table showing an example of calculating a resistance ratio of each semiconductor layer of the main element domain and a resistance ratio of each semiconductor layer of the sense element domain.

FIG. 6 shows values of currents respectively flowing through the semiconductor layers 20, 30, and 40 when the predetermined potential is applied to each of the semiconductor layers 20, 30, and 40. FIG. 6 shows a ratio of a current value at each temperature to a current value at the reference temperature (temperature-dependent resistance changing rate) with the current value at the reference temperature (25° C.) as the reference. As is obvious from FIG. 6, when the temperature of the semiconductor device increases, the values of currents respectively flowing through the semiconductor substrate 20 ("Substrate" in FIG. 6), the drift layer 30 ("Drift" in FIG. 6), and the body region 40 ("Channel" in FIG. 6) decrease. In other words, the resistance values of the semiconductor substrate 20, the drift layer 30, and the body region 40 increase. Further, as is obvious from FIG. 6, the temperature-dependent resistance changing rate of the drift layer 30 is substantially equal to that of the body region 40, and the temperature-dependent resistance changing rate of the semiconductor substrate 20 is smaller than that of the drift layer 30 and the body region 40. The results shown in FIG. 6 were obtained under the conditions that the impurity concentration of the semiconductor substrate 20 is $23 \times e^{19}$ cm$^{-3}$, the impurity concentration of the drift region 30 is $2.0 \times e^{16}$ cm$^{-3}$, and the impurity concentration of the body region 40 is $1.0 \times e^{17}$ cm$^{-3}$.

Next, the resistance ratio of each of the semiconductor layers 20, 30, and 40 of each of the main element domain 1 and the sense element domain 2 is calculated (step S14). The term "resistance ratio" herein described refers to an amount (ratio) of resistance components included in each of the semiconductor layers 20, 30, and 40 relative to the entire semiconductor region 100. As the resistance ratio, a resistance ratio of each of the semiconductor layers 20, 30, and 40 obtained at the reference temperature may be used.

As a specific method for calculating the resistance ratio, the resistance ratio may be calculated by a simulation using a well-known device simulator (for example, TCAD (GENNESIS) manufactured by ISE Corporation). That is, the potential or the like of each part in the main element domain 1 can be calculated by a simulation performed on the main element domain 1, and the resistance ratio of each of the semiconductor layers 20, 30, and 40 of the main element domain 1 can be calculated from this calculation result. Further, the potential or the like of each part in the sense element domain 2 can be calculated by a simulation performed on the sense element domain 2, and the resistance ratio of each of the semiconductor layers 20, 30, and 40 of the sense element domain 2 can be calculated from this calculation result.

Figure 8:
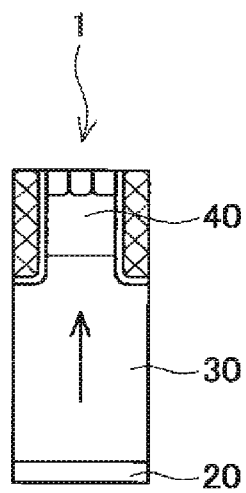
FIG. 8 shows a simulation model of the main element domain.

FIG. 8 shows a simulation model of the main element domain 1. As shown in FIG. 8, the simulation model of the main element domain 1 is obtained by modeling only one MOSFET. This is because, in the main element domain 1, the effect of current flowing from the outside of the main element domain is small and thus there is no need to take into consideration the current flowing obliquely. The arrow in FIG. 8 indicates a current flowing direction.

Figure 9:
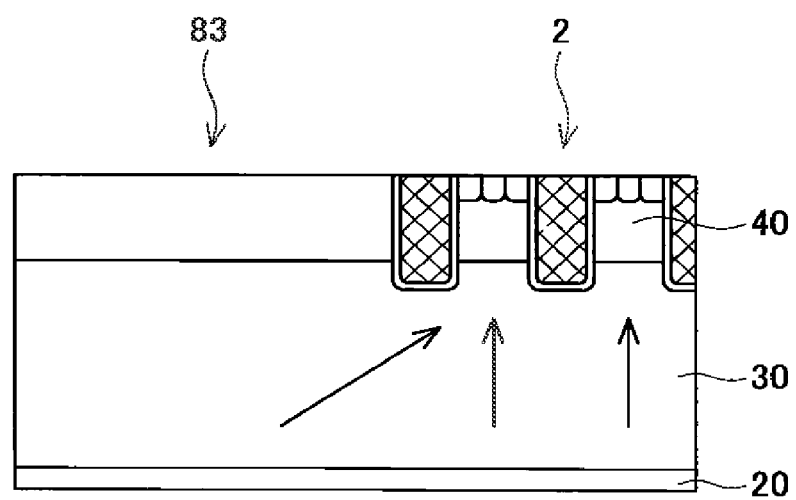
FIG. 9 shows a simulation model of the sense element domain.

FIG. 9 shows a simulation model of the sense element domain 2. As shown in FIG. 9, the simulation model of the sense element domain 2 is obtained by modeling two MOSFETs and a non-element region (a region in which no MOSFET is formed) disposed adjacent to these MOSFETs. In the sense element domain 2, the effect of current flowing from the outside of the sense element domain is large. Accordingly, it is necessary to take into consideration the current flowing obliquely (indicated by the arrow extending obliquely in FIG. 9). The number of MOSFETs incorporated in the simulation model and the size of the non-element region can be appropriately determined based on the layout of the main element domain 1 and the sense element domain 2.

FIG. 7 shows a result of calculating the resistance ratio of each of the semiconductor layers 20, 30, and 40 by a simulation using the simulation models (FIGS. 8 and 9) described above. As is obvious from FIG. 7, in the sense element domain 1, the resistance ratio of the semiconductor substrate 20 is small and the resistance ratio of each of the drift region 30 and the body region 40 is large. On the other hand, in the main element domain 2, the resistance ratio of the semiconductor substrate 20 is larger than that of the sense element domain 1.

As described above, the temperature-dependent resistance changing rate of the semiconductor substrate 20 is greatly different from the temperature-dependent resistance changing rate of each of the drift region 30 and the body region 40 (see FIG. 6). In the main element domain 1, the resistance ratio of the semiconductor substrate 20 is large, while in the sense element domain 2, the resistance ratio of the semiconductor substrate 20 is small. Accordingly, when the temperature of the semiconductor device changes, the difference between the resistance value of the main element domain 1 and the resistance value of the sense element domain 2 becomes large, resulting in a change in current sense ratio.

After the calculation of the resistance ratio, an evaluation value for evaluating the temperature-dependent resistance changing rate of each of the main element domain 1 and the sense element domain 2 is calculated using the temperature-dependent resistance changing rate calculated in step S12 and the resistance ratio calculated in step S14 (step S16). Specifically, the temperature-dependent resistance changing rate ($R_{Mi}$) of each of the semiconductor layers 20, 30, and 40 is multiplied by the resistance ratio ($k_{Mi}$) of each of the semiconductor layers 20, 30, and 40 for the main element domain 1, and the sum of these values is obtained. Similarly, the temperature-dependent resistance changing rate ($R_{Si}$) of each of the semiconductor layers 20, 30, and 40 is multiplied by the resistance ratio ($k_{Si}$) of each of the semiconductor layers 20, 30, and 40 for the sense element domain 2, and the sum of these values is obtained.

Next, an index value for evaluating a temperature-dependent variation of a current sense ratio is calculated from the evaluation value $\Sigma(R_{Mi} \times k_{Mi})$ of the main element domain 1 and the evaluation value $\Sigma(R_{Si} \times k_{Si})$ of the sense element domain 2, which are calculated in step S16, to determine whether the index value is smaller than a predetermined value (step S18). Specifically, the evaluation value $\Sigma(R_{Si} \times k_{Si})$ of the sense element domain 2 is subtracted from the evaluation value $\Sigma(R_{Mi} \times k_{Mi})$ of the main element domain 1, and the subtracted value is divided by the evaluation value $\Sigma(R_{Mi} \times k_{Mi})$ of the main element domain 1.

When the calculated index value is smaller than the predetermined value, it can be determined that the temperature-dependent variation of the current sense ratio falls within a desired range. Accordingly, the impurity concentration and the thickness of each of the semiconductor layers 20, 30, and 40, which are temporarily determined in step S10, are determined as the final impurity concentration and thickness. When the index value exceeds the predetermined value, it can be determined that the temperature-dependent variation of the current sense ratio exceeds the desired range. Therefore, the flow returns to step S10, and the processing from step S10 is repeated. Specifically, the impurity concentration and the thickness of each of the semiconductor layers 20, 30, and 40 of the main element domain 1 and/or the sense element domain are changed so that the index value is set to be smaller than the predetermined value. Thus, conditions for setting the index value to be smaller than the predetermined value can be determined.

Figures 10, 11:
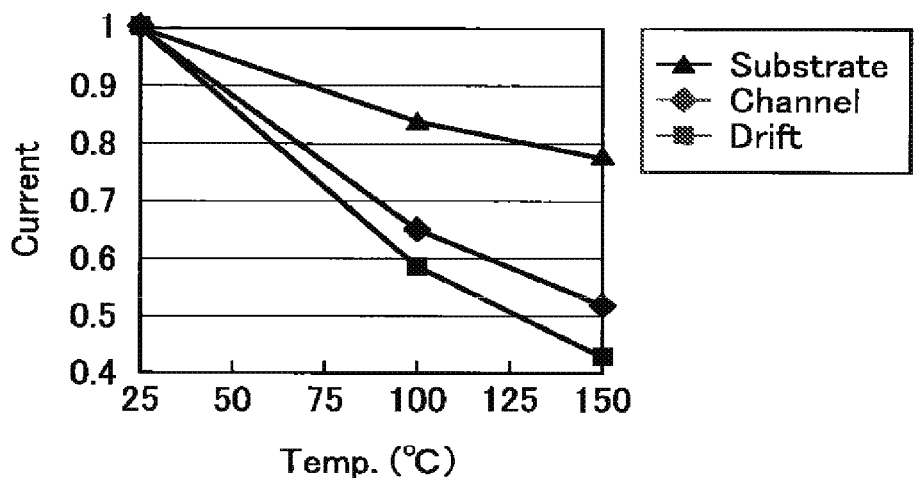
FIG. 10 is a graph showing another example of the temperature-dependent resistance changing rate of each semiconductor layer.
FIG. 11 is a table showing another calculation example of a resistance ratio of each semiconductor layer of the main element domain and a resistance ratio of each semiconductor layer of the sense element domain.

Referring now to FIGS. 10 and 11, a specific example of calculating the index value in step S18 will be described. In this calculation example, assume that the impurity concentration of the semiconductor substrate 20 is $23 \times e^{19}$ cm$^{-3}$; the impurity concentration of the drift region 30 is $2.0 \times e^{16}$ cm$^{-3}$; and the impurity concentration of the body region 40 is $1.0 \times e^{17}$ cm$^{-3}$.

Referring to FIG. 10, a current ratio (i.e., a temperature-dependent resistance changing rate) of each of the semiconductor layers 20, 30, and 40 is calculated at each of 100° C. and 150° C. Referring to FIG. 11, the resistance ratio of each of the semiconductor layers 20, 30, and 40 of the main element domain 1 and the resistance ratio of each of the semiconductor layers 20, 30, and 40 of the sense element domain 2 at the reference temperature (25° C.) are calculated.

The index value is calculated in the following manner using the temperature-dependent resistance changing rate obtained at 150° C. As shown in FIG. 10, the temperature-dependent resistance changing rate of the semiconductor substrate 20 at 150° C. is 0.78; the temperature-dependent resistance changing rate of the drift region 30 is 0.52; and the temperature-dependent resistance changing rate of the body region 40 is 0.43. Accordingly, the evaluation value for evaluating the temperature-dependent resistance changing rate of the main element domain 1 is calculated by $0.78 \times 0.30 + 0.52 \times 0.36 + 0.43 \times 0.34 = 0.567$. The evaluation value for evaluating the temperature-dependent resistance changing rate of the sense element domain 2 is calculated by $0.78 \times 0.03 + 0.52 \times 0.43 + 0.43 \times 0.54 = 0.479$. Thus, the index value for evaluating the temperature-dependent variation of the current sense ratio is calculated by $(0.567 - 0.479) \times 0.567 = 0.155$. As a result, the temperature-dependent variation of the current sense ratio can be evaluated as 15.5%.

Here, an exemplary configuration of the semiconductor device capable of reducing the index value (temperature-dependent variation of current sense ratio) will be described.

Figure 15:
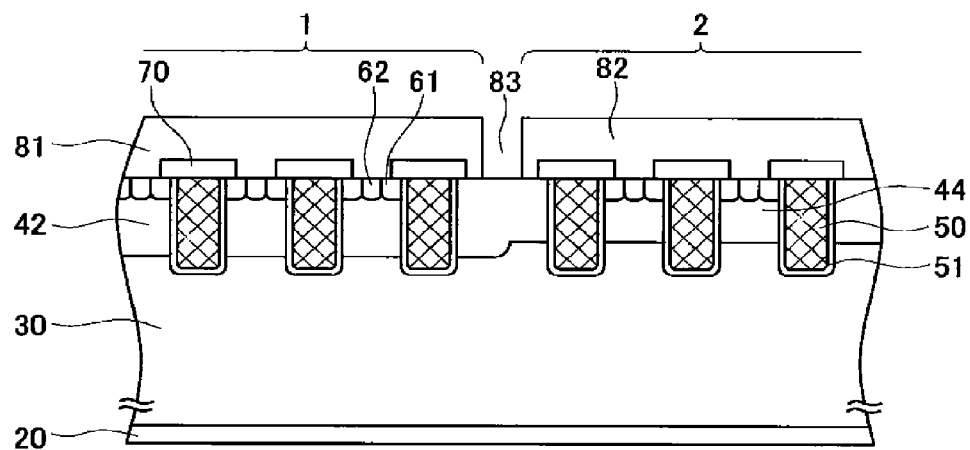
FIG. 15 shows an embodiment in which the thicknesses of a body region and a drift region are changed in each of the main element domain and the sense element domain.

As shown in FIG. 11, the resistance ratio of the body region (i.e., the resistance ratio of the channel) in the sense element domain 2 is larger than that of the main element domain 1. Accordingly, the above-mentioned index value can be reduced by reducing the resistance ratio of the body region of the sense element domain 2. For example, as shown in FIG. 15, the thickness of the body region 44 of the sense element domain 2 is set to be smaller than that of the body region 42 of the main element domain 1. This results in a reduction in the resistance ratio of the body region of the sense element domain 2 and a reduction in the index value (temperature-dependent variation of current sense ratio).

The impurity concentration of the body region of the sense element domain 2 may be reduced without changing the thickness of the body region 44 of the sense element domain 2. Also in this case, a reduction in the resistance ratio of the body region of the sense element domain 2 and a reduction in the temperature-dependent variation of the current sense ratio can be achieved.

Figure 16:
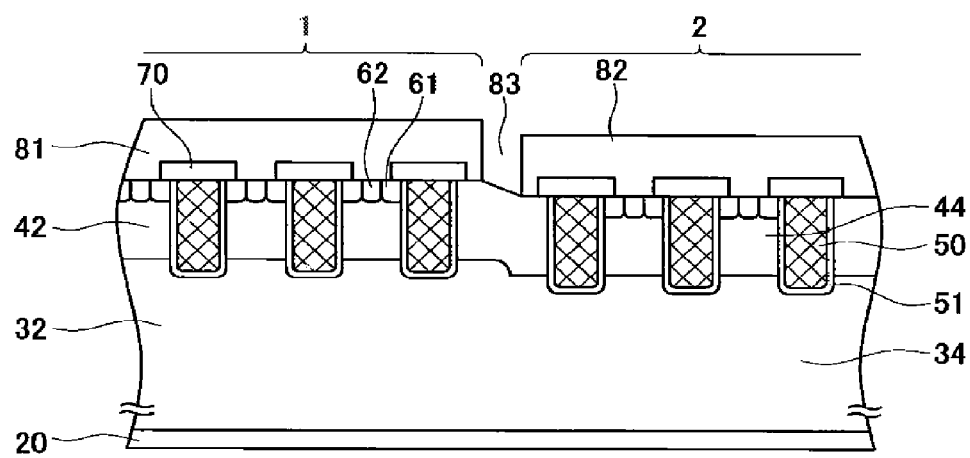
FIG. 16 shows an embodiment in which the thickness of the drift region is changed in each of the main element domain and the sense element domain.

As shown in FIG. 11, the resistance ratio of the drift region of the sense element domain 2 is larger than that of the main element domain 1. Accordingly, the index value can be reduced by reducing the resistance ratio of the drift region of the sense element domain 2. For example, as shown in FIG. 16, the thickness of the drift region 34 of the sense element domain 2 is set to be smaller than that of the drift region 32 of the main element domain 1. This results in a reduction in the resistance ratio of the drift region of the sense element domain 2 and a reduction in the temperature-dependent variation of the current sense ratio.

Also in this case, the resistance ratio of the drift region of the sense element domain 2 may be reduced by changing the impurity concentration of the drift region of the sense element domain 2 without changing the thickness of the drift region of the sense element domain 2.

Figure 17:
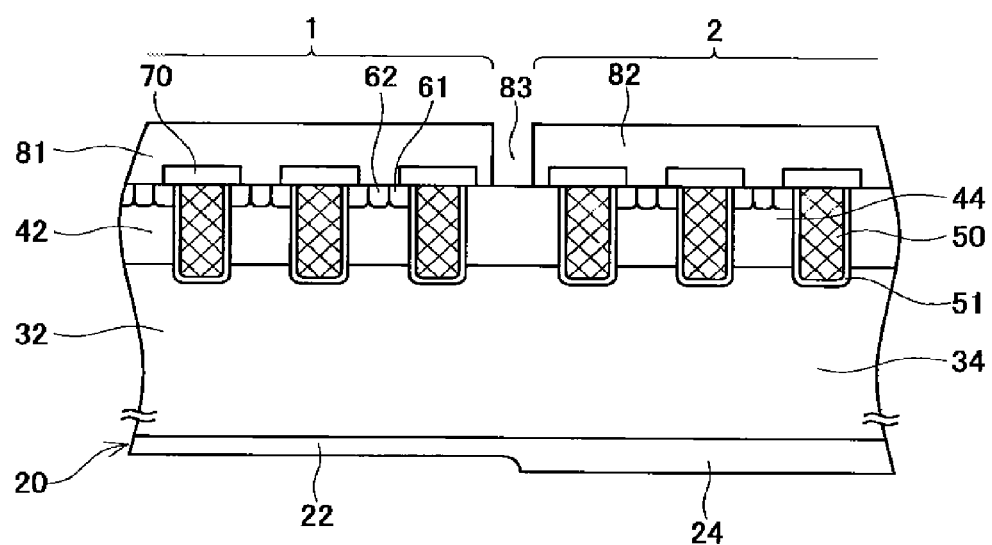
FIG. 17 shows an embodiment in which the thickness of a semiconductor substrate is changed in each of the main element domain and the sense element domain.

Further, as shown in FIG. 11, the resistance ratio of the semiconductor substrate in the sense element domain 2 is smaller than that of the main element domain 1. Accordingly, the index value can be reduced by increasing the resistance ratio of the semiconductor substrate in the sense element domain 2. For example, as shown in FIG. 17, the thickness of a semiconductor substrate 24 in the sense element domain 2 is set to be larger than that of a semiconductor substrate 22 in the main element domain L This results in an increase in the resistance ratio of the semiconductor substrate 24 in the sense element domain 2 and a reduction in the temperature-dependent variation of the current sense ratio.

Also in this case, the resistance ratio of the semiconductor substrate in the sense element domain 2 may be increased by changing the impurity concentration of the semiconductor substrate without changing the thickness of the semiconductor substrate in the sense element domain 2.

The predetermined value to be compared in step S18 with the index value (index value for evaluating the temperature-dependent variation of the current sense ratio) can be appropriately determined depending on the performance required for the semiconductor device. For example, assuming that the predetermined value is 0.1 (assuming that the difference is 10% or less), the variation of the current sense ratio within the temperature range of 25° C. to 150° C. can be set to 15% or less. Assuming that the predetermined value is 0.07 (assuming that the difference is 7% or less), the variation of the current sense ratio within the temperature range of 25° C. to 150° C. can be set to 6% or less. Assuming that the predetermined value is 0.05 (assuming that the difference is 5% or less), the variation of the current sense ratio within the temperature range of 25° C. to 150° C. can be set to 5% or less. Assuming that the predetermined value is 0.02 (assuming that the difference is 2% or less), the variation of the current sense ratio within the temperature range of 25° C. to 150° C. can be set to 3% or less. Thus, the predetermined value may be set depending on the variation of the temperature-dependent sense current ratio required for the semiconductor device.

As is obvious from the above description, in the semiconductor device of this embodiment, the evaluation value $\Sigma(R_{Mi} \times k_{Mi})$ for evaluating the temperature-dependent resistance changing rate of the entire main element domain 1 and the evaluation value $\Sigma(R_{Si} \times k_{Si})$ for evaluating the temperature-dependent resistance changing rate of the entire sense element domain 2 are calculated using the temperature-dependent resistance changing rate and the resistance ratio of each of the semiconductor layers 20, 30, and 40. In the case of calculating the resistance ratio of the sense element domain 2, sense elements (MOSFETs) as well as the non-element region adjacent to the sense elements are incorporated in the simulation models. As a result, the resistance ratio of each of the semiconductor layers 20, 30, and 40 can be calculated in consideration of the current flowing obliquely through the semiconductor layers 20, 30, and 40. Accordingly, the evaluation value $\Sigma(R_{Si} \times k_{Si})$ for evaluating the temperature-dependent resistance changing rate of the sense element domain 2 described above is a value obtained by taking into consideration the current flowing obliquely through the semiconductor region 100. Then, based on the value obtained by taking into consideration the current flowing obliquely through the semiconductor region 100, the impurity concentration and the thickness of each of the semiconductor layers 20, 30, and 40 are changed so that the difference between the temperature-dependent resistance changing rate of the entire main element domain 1 and the temperature-dependent resistance changing rate of the entire sense element domain 2 can be reduced. Consequently, a semiconductor device having a small temperature-dependent variation of the current sense ratio can be obtained.

The semiconductor device of this embodiment is capable of reducing the temperature-dependent variation of the current sense ratio, thereby eliminating the need to design another component assuming that the temperature-dependent variation of the current sense ratio deteriorates. In other words, if the temperature-dependent variation of the current sense ratio is large, the accuracy of the calculated main current value is lowered. This raises a need to use a component for large current as a fuse for forcibly blocking current flowing to the semiconductor device, or as a wire harness connected to the semiconductor device. In the semiconductor device of this embodiment, however, the temperature-dependent variation of the current sense ratio is small, and thus the accuracy of the calculated main current value is increased. As a result, a component for low current can be used as a fuse or a wire harness, which leads to a reduction in manufacturing costs.

The semiconductor device of this embodiment can be suitably used for a control circuit for controlling charging/discharging of a secondary cell such as a lithium cell. In order to accurately charge/discharge the secondary cell, it is necessary to accurately detect a value of current flowing to the secondary cell and a value of current flowing out of the secondary cell. Meanwhile, in the case of charging/discharging the secondary cell, the secondary cell generates heat, so that the temperature of the control circuit varies. The semiconductor device of this embodiment has a small temperature-dependent variation of the current sense ratio. Accordingly, even when the temperature of the control circuit changes during charging/discharging of the secondary cell, a value of a charging current flowing to the secondary cell and a value of a discharging current flowing out of the secondary cell can be detected accurately. This makes it possible to charge/discharge the secondary cell with high accuracy.

Furthermore, since the semiconductor device of this embodiment has a small temperature-dependent variation of the current sense ratio, the semiconductor device can be used for various purposes (for example, a compact DCDC converter), unlike the related art. This eliminates the need for a shunt resistor which has been conventionally needed. The shunt resistor has a particularly large calorific value, which requires a countermeasure for the heat and results in a complicated thermal design. Therefore, the advantageous effect of eliminating the need for the shunt resistance is large.

Figure 12:
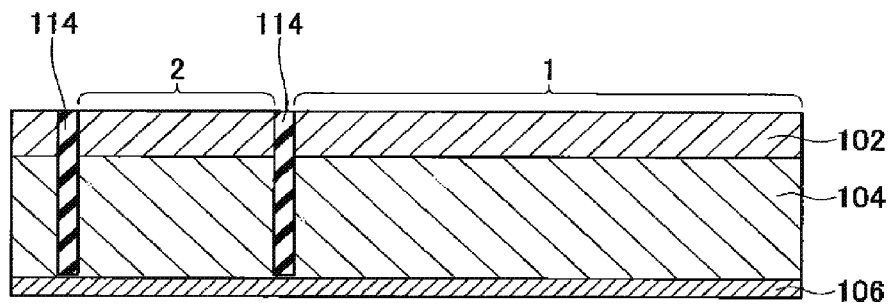
FIG. 12 is a schematic view showing an example in which a trench is formed between the main element domain and the sense element domain.
Figure 13:
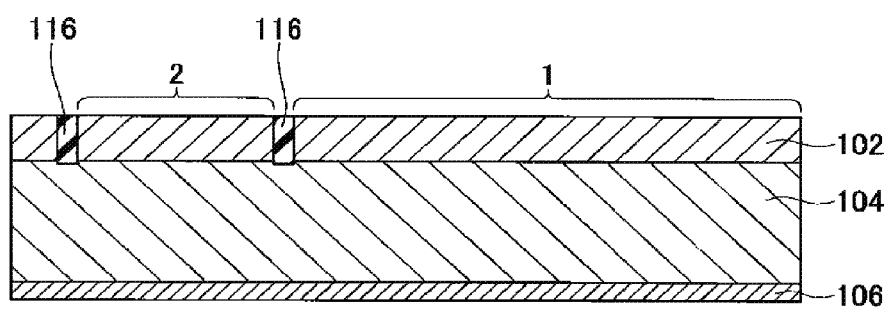
FIG. 13 is a schematic view showing another example in which a trench is formed between the main element domain and the sense element domain.
Figure 14:
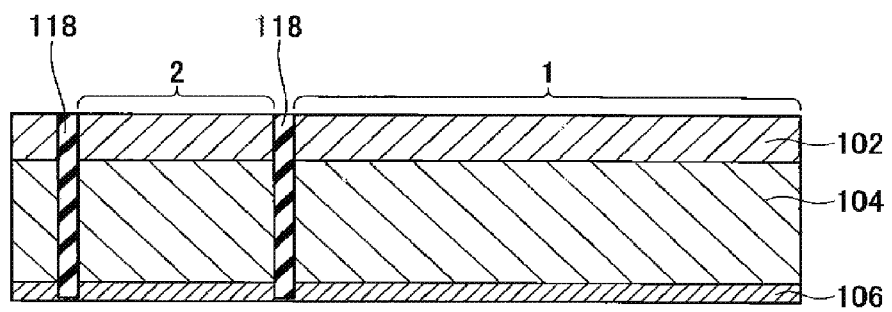
FIG. 14 is a schematic view showing still another example in which a trench is formed between the main element domain and the sense element domain.

In the embodiment described above, a structure such as a trench is not formed in the insulating region 83 between the main element domain 1 and the sense element domain 2. However, as shown in FIGS. 12 to 14, trenches 114, 116, and 118 may be formed in the region between the main element domain 1 and the sense element domain 1 The trenches 114, 116, and 118 are preferably formed to surround the sense element domain 2. An oxide film, a polysilicon layer, or an n⁺ layer may be filled in each of the trenches 114, 116, and 118. In any case, the trenches 114, 116, and 118 are formed so as to prevent current from flowing across the trenches. The depth of each of the trenches 114, 116, and 118 can be arbitrarily determined. For example, as shown in FIG. 12, the trench 114 may be formed in the range from the body region 102 to the drift region 104. Alternatively, as shown in FIG. 13, the trench 116 may be formed only within the range of the body region 102. More alternatively, as shown in FIG. 14, the trench 118 may be formed in the range including the body region 102, the drift region 104, and the semiconductor substrate 104. The range of the region in which current is controlled to be prevented from flowing obliquely can be selected by changing the depth of each of the trenches 114, 116, and 118.

The formation of the trenches 114, 116, and 118 as described above prevents current from flowing obliquely through the semiconductor region. Particularly in the sense element domain 2, current is prevented from flowing from the outside of the sense element domain 2. As a result, the resistance ratio of each of the semiconductor layers 20, 30, and 40 in the main element domain 1 is close to that in the sense element domain 2, so that the temperature-dependent variation of the current sense ratio can be reduced.

Although the above embodiment illustrates an example in which the present invention is applied to MOSFETs, the present invention can also be applied to other semiconductor devices such as an IGBT and a diode. Furthermore, the above embodiment illustrates an example in which the present invention is applied to a vertical semiconductor device, but the present invention can also be applied to a lateral semiconductor device.

The present invention also provides a design support device that executes the processing shown in FIG. 5. Such a design support device may include a storage device for storing a program for executing the processing shown in FIG. 5; an arithmetic unit for executing the program stored in the storage device; an input device for inputting calculation conditions and a simulation model to the arithmetic unit; and an output device (for example, a display device) for outputting calculation results from the arithmetic unit. When a designer inputs design conditions (such as an impurity concentration and a thickness of each semiconductor layer) to the design support device, the design support device calculates an index value, and outputs the calculated index value to the output device. This allows the designer to easily determine an appropriate impurity concentration and the thickness of each semiconductor layer.

Specific embodiment of the present invention is described above, but this merely illustrates some representative possibilities for utilizing the invention and does not restrict the claims thereof The subject matter set forth in the claims includes variations and modifications of the specific examples set forth above.

The technical elements disclosed in the specification or the drawings may be utilized separately or in all types of combinations, and are not limited to the combinations set forth in the claims at the time of filing of the application. Furthermore, the subject matter disclosed herein may be utilized to simultaneously achieve a plurality of objects or to only achieve one object.

The invention claimed is:

1. A semiconductor device comprising:
a main element domain; and
a sense element domain disposed adjacent to the main element domain; wherein
each of the main element domain and the sense element domain comprises a first semiconductor layer, a second semiconductor layer directly laminated on the first semiconductor layer, and a third semiconductor layer directly laminated on the second semiconductor layer, and
an impurity concentration of the second semiconductor layer is lower than that of the first semiconductor layer,
an insulating film and a trench gate electrode penetrating the third semiconductor layer and facing the third semiconductor layer via the insulating film:
the first semiconductor layer is a continuous layer between the main element domain and the sense element domain,
the second semiconductor layer is a continuous layer between the main element domain and the sense element domain,
the third semiconductor layer is a continuous layer between the main element domain and the sense element domain via the trench gate and the insulating film,
wherein when the semiconductor device turns on, a channel is formed in each of the third semiconductor layers of the main element domain and the sense element domain, and current flows from the second semiconductor layer to the third semiconductor layer or from the third semiconductor layer to the second semiconductor layer, and
a thickness of the second semiconductor layer of the sense element domain is smaller than that of the second semiconductor layer of the main element domain.

2. The semiconductor device as in claim 1, wherein
in at least one of the semiconductor layers from the first semiconductor layer to the third semiconductor layer of the main element domain and the sense element domain, at least one of an impurity concentration and a thickness of the at least one of the semiconductor layers of the main element domain is different from that of the at least one of the semiconductor layers of the sense element domain such that a value calculated by a following equation is less than 0.1:

$$\left[\sum_{i=1}^{3}(R_{Mi} \times k_{Mi}) - \sum_{i=1}^{3}(R_{Si} \times k_{Si})\right] / \sum_{i=1}^{3}(R_{Mi} \times k_{Mi})$$

where a temperature-dependent resistance changing rate of an i-th semiconductor layer (i=1 to 3) of the main element domain is $R_{Mi}$,
a resistance ratio of the i-th semiconductor layer of the main element domain relative to the entire main element domain is $k_{Mi}$,
a temperature-dependent resistance changing rate of the i-th semiconductor layer of the sense element domain is $R_{Si}$, and
a resistance ratio of the i-th semiconductor layer of the sense element domain to the entire sense element domain is $k_{Si}$.

* * * * *

UNITED STATES PATENT AND TRADEMARK OFFICE
CERTIFICATE OF CORRECTION

PATENT NO. : 8,933,483 B2  
APPLICATION NO. : 14/074212  
DATED : January 13, 2015  
INVENTOR(S) : Hidefumi Takaya et al.

Page 1 of 1

It is certified that error appears in the above-identified patent and that said Letters Patent is hereby corrected as shown below:

In the Specification

At column 2, lines 43 and 44, change "sense celement domain." to -- sense element domain. --.

At column 7, line 11, change "an aluminum' wiring line." to -- an aluminum wiring line. --.

At column 7, line 28, change "the drill region 30" to -- the drift region 30 --.

At column 8, line 10, change "current i which" to -- current Is which --.

At column 9, line 64, change "$23 \times e^{19} cm^{-3}$" to -- $2.7 \times e^{19} cm^{-3}$ --.

At column 11, line 49, change "$23 \times e^{19} cm^{-3}$" to -- $2.7 \times e^{19} cm^{-3}$ --.

Signed and Sealed this  
Twenty-ninth Day of September, 2015

Michelle K. Lee  
*Director of the United States Patent and Trademark Office*